(12) United States Patent
Teo et al.

(10) Patent No.: US 7,899,422 B1
(45) Date of Patent: *Mar. 1, 2011

(54) SIGMA DELTA MODULATED PHASE LOCK LOOP WITH PHASE INTERPOLATION

(75) Inventors: Swee-Ann Teo, Sunnyvale, CA (US); Yonghua Song, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 1024 days.

This patent is subject to a terminal disclaimer.

(21) Appl. No.: 11/626,829

(22) Filed: Jan. 24, 2007

Related U.S. Application Data

(63) Continuation of application No. 10/738,368, filed on Dec. 15, 2003, now Pat. No. 7,181,180.

(60) Provisional application No. 60/470,626, filed on May 15, 2003.

(51) Int. Cl.
*H04B 1/40* (2006.01)

(52) U.S. Cl. .................. 455/258; 455/260; 375/327

(58) Field of Classification Search .............. 455/76, 455/255, 260, 258, 264, 265, 256, 257, 261, 455/262, 318; 375/327, 376; 331/1 R, 16, 331/17, 1 A See application file for complete search history.

(56) References Cited

U.S. PATENT DOCUMENTS

| | | | |
|---|---|---|---|
| 5,986,512 A | 11/1999 | Eriksson | |
| 6,031,426 A | 2/2000 | Yechuri | |
| 6,044,124 A | 3/2000 | Monahan et al. | |
| 6,420,940 B1 | 7/2002 | Minnis et al. | |
| 6,509,773 B2 | 1/2003 | Buchwald et al. | |
| 6,542,013 B1 | 4/2003 | Volk et al. | |
| 6,703,901 B2 | 3/2004 | Jovenin et al. | |
| 6,788,154 B2 * | 9/2004 | Maneatis | 331/45 |
| 6,823,033 B2 | 11/2004 | Fahim | |
| 7,312,642 B1 * | 12/2007 | Li et al. | 327/105 |
| 2001/0036240 A1 | 11/2001 | Gossmann et al. | |
| 2002/0036544 A1 * | 3/2002 | Jackson et al. | 331/1 A |
| 2002/0163389 A1 | 11/2002 | Jun | |
| 2003/0108143 A1 | 6/2003 | Han et al. | |
| 2003/0198311 A1 * | 10/2003 | Song et al. | 375/376 |
| 2005/0275481 A1 | 12/2005 | Grewing et al. | |
| 2008/0260071 A1 * | 10/2008 | Sidiropoulos et al. | 375/334 |

FOREIGN PATENT DOCUMENTS

WO WO 0002316 A1 1/2000

OTHER PUBLICATIONS

IEEE Computer Society, "*Information Technology—Telecommunications and Information Exchange Between Systems—Local and Metropolitan Area Networks—Specific Requirements—Part 11: Wireless LAN Medium Access Control (MAC) and Physical Layer (PHY) Specifications*", IEEE Std 802.11—First Edition, 1999.

(Continued)

*Primary Examiner*—Blane J Jackson

(57) ABSTRACT

A sigma delta modulated phase lock loop reduces quantization noise by using phase interpolation to increase an effective frequency resolution of the dividing ratio of a divider.

33 Claims, 6 Drawing Sheets

OTHER PUBLICATIONS

IEEE Computer Society, "*Supplement to IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: High-speed Physical Layer in the 5 GHZ Band*", IEEE Std 802.11a—1999 (Supplement to IEEE Std 802.11—1999).

IEEE Computer Society, "*Supplement to IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Higher-speed Physical Layer Extension in the 2.4 GHZ Band*", IEEE Std 802.11b—1999 (Supplement to IEEE Std 802.11—1999).

IEEE Computer Society, "*IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Amendment 7: Medium Access Control (MAC) Quality of Service (QoS) Enhancements*", IEEE P802.11e/D11.0, Oct. 2004.

IEEE Computer Society, "*IEEE Standard for Information Technology—DRAFT Supplement to Standard [for] Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Further Higher Data Rate Extension in the 2.4 GHz Band*", IEEE P802.11g/D8.2, Apr. 2003.

IEEE Computer Society, "*IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Amendment 5: Spectrum and Transmit Power Management Extensions in the 5 GHz Band in Europe*", IEEE P802.11h—2003.

IEEE Computer Society, "*IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Amendment 6: Medium Access Control (MAC) Security Enhancements*", IEEE Std 802.11i—2004.

IEEE Computer Society, "*IEEE Project 802.14/a Draft 3 Revisions 3—Cable-TV Access Method and Physical Layer Specification*", IEEE 802.14 Draft3 R3—Oct. 25, 1998.

"*Delta Sigma Data Converters Theory, Design, and Simulation*" (Steven R. Norsworthy et. al), IEEE Press (1997).

\* cited by examiner

SIGMA DELTA MODULATED PHASE LOCK LOOP WITH PHASE INTERPOLATION

CROSS-REFERENCE TO RELATED APPLICATIONS

The present application claims priority to U.S. patent application Ser. No. 10/738,368, filed on Dec. 15, 2003 which claims priority to U.S. Provisional Patent Application No. 60/470,626, filed on May 15, 2003, which is incorporated herein by reference in its entirety.

BACKGROUND

Communication transmitters traditionally employ a phase locked loop (PLL) for frequency synthesis of a communication carrier signal modulated with transmission data. The PLL allows the carrier signal frequency to be precisely controlled and, accordingly, permits the data on which the carrier signal modulation is based to be reliably transmitted at a stable, known frequency. A conventional PLL frequency synthesizer is shown in FIG. 1 and includes a voltage controlled oscillator (VCO) 100 that produces a VCO output signal 102 at a desired frequency based on a VCO frequency control signal 104. VCO frequency control signal 104 is generated by a feedback loop 106. VCO output signal 102 is coupled through feedback loop 106 to a phase-frequency detector 108 which compares the phase (or frequency) of VCO output signal 102 (or multiple thereof as described below) to that of a fixed-frequency reference signal 110. Phase-frequency detector 108 generates an error signal 112 corresponding to a phase (or frequency) difference between VCO output signal 102 and fixed-frequency reference signal 110. A charge pump 114 converts error signal 112 from phase-frequency detector 108 into a charge pump output signal 116. Charge pump output signal 116 is smoothed by a low pass loop filter 118 to generate VCO control signal 104. VCO control signal 104 is then applied to VCO 100 such that, in its steady state, the phase (or frequency) of VCO output signal 102 matches that of fixed-frequency reference signal 110.

Typically, a frequency divider 120 is included in PLL feedback loop 106 to divide the frequency of VCO output signal 102 to a frequency that is a multiple of that of fixed-frequency reference signal 110. Frequency divider 120 generates a divided frequency output signal 122 that is compared by phase-frequency detector 108 to fixed-frequency reference signal 110. The frequency of a carrier signal produced by VCO 100 is constantly controlled such that it is phase locked to a multiple of that of fixed-frequency reference signal 110. For example, if frequency divider 120 divides by integers only, the smallest increment (i.e., step size) in the frequency of VCO output signal 102 is equal to the frequency of fixed-frequency reference signal 110.

To increase the VCO output frequency resolution, frequency divider 120 is typically implemented as a fractional divider. A fractional divider fractionally divides an input signal. In one example, a control circuit controls an integer component (N) and a fractional component (F) by which the frequency of VCO output signal 102 is divided. Different techniques can be used to implement fractional N division. In one technique, division by (N)(F) is achieved by averaging the divisor such that the output frequency is divided by (N) for (F) portion of a duty cycle and divided by (N+1) for (1−F) portion of the duty cycle. Switching between divisors in a fixed, periodic pattern, however, results in fractional spurs—i.e., undesirable phase jitter or phase noise near the carrier frequency.

A general technique to reduce fractional spurs is to cascade multiple stages of first or second order sigma delta modulators and supply an output of each stage to digital cancellation logic as described in "Delta Sigma Data Converters Theory, Design, and Simulation (Steven R. Norsworthy et. Al), IEEE Press (1997).

One particular feature of sigma delta modulated PLLs is that a sigma delta modulator introduces quantization noise at a high frequency that is proportional to the step size of the dividing ratio. The dividing ratio is the ratio of the VCO output frequency and the output frequency of the divider. For example, if the step size is 2 (i.e., the dividing ratio of the first divider is N/N+2, such that the overall dividing ratio is even and can be increased in unit steps of 2), the quantization noise will be 6 dB higher compared to the case in which the step size is 1 (i.e., the dividing ratio of the first divider is N/N+1, such that the overall dividing ratio can be even and increased in unit steps of 1).

SUMMARY

In general, in one aspect, this specification describes a phase lock loop. The phase lock loop includes a voltage controlled oscillator operable to generate an output carrier signal having a controlled frequency, and a sigma delta modulator operable to generate a dither control signal. The phase lock loop further includes a phase interpolator operable to receive one or more phase signals, and generate an interpolated output signal based in part on the dither control signal for controlling the frequency of the output carrier signal. Each of the phase signals received by the phase interpolator are delayed with respect to the output carrier signal.

Particular implementations can include one or more of the following features. The interpolated output signal can be a weighted sum of one or more of the one or more phase signal. The phase lock loop can further include a divider to receive the interpolated output signal from the phase interpolator. The divider can divide the interpolated output signal based in part on the dither control signal and generate a divided output signal. The divider can be a fractional N divider operable to fractionally divide the interpolated output signal, or an integer only divider operable to divide the interpolated output signal by integers. The voltage controlled oscillator can be a multiphase voltage controlled oscillator operable to generate one or more delay signals. Each of the one or more delay signals can be delayed by a predetermined time period with respect to the output carrier signal. One or more of the one or more input phases can be derived based at least in part from the one or more delay signals.

The phase lock loop can further include a prescaler operable to generate one or more of the one or more phase signals for the phase interpolator. The phase lock loop can further include a phase-frequency detector operable to compare a reference signal to the divided output signal and generate an error signal corresponding to a frequency difference between the reference signal and the divided output signal. The phase lock loop can further include a charge pump operable to convert the error signal into a charge pump output signal. The phase lock loop can further include a loop filter operable to smooth the charge pump output signal and generate a voltage controlled oscillator control signal to control the voltage controlled oscillator.

In general, in another aspect, this specification describes a method including generating an output carrier signal having a controlled frequency, generating a dither control signal, generating one or more phase signals, and interpolating the phase signals and generating an interpolated output signal based in part on the dither control signal for controlling the frequency of the output carrier signal. Each of the phase signals are delayed with respect to the output carrier signal.

In general, in another aspect, this specification describes a wireless transceiver. The wireless transceiver includes a transmitter operable to transmit a modulated carrier signal. The transmitter includes a phase lock loop operable to control a frequency of the modulated carrier signal. The phase lock loop includes a voltage controlled oscillator operable to generate an output carrier signal having a controlled frequency, and a sigma delta modulator operable to generate a dither control signal. The phase lock loop further includes a phase interpolator operable to receive one or more phase signals, and generate an interpolated output signal based in part on the dither control signal for controlling the frequency of the output carrier signal. Each of the phase signals received by the phase interpolator are delayed with respect to the output carrier signal.

Advantages that can be seen in implementations of the invention include one or more of the following. A PLL is provided that advantageously reduces quantization noise. Phase interpolation can be used in combination with a divider to increase the effective frequency resolution of the dividing ratio—i.e., reduces the step size. Such a PLL can have a high loop bandwidth. When the loop bandwidth of the PLL is increased, a faster loop response results, and noise performance may be improved.

The details of one or more embodiments are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 2:
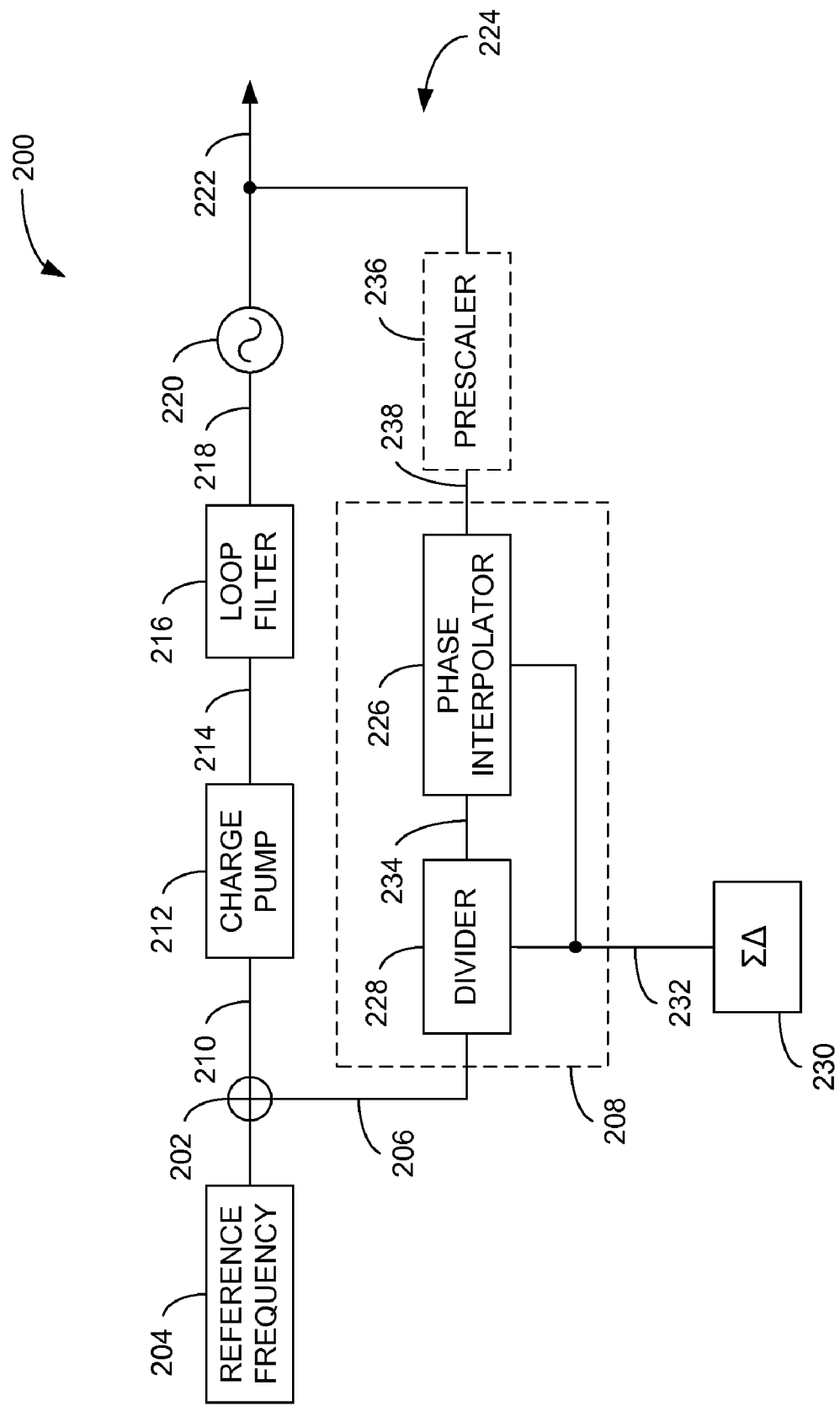
FIG. 2 is block diagram of a PLL including a sigma delta modulator and a phase interpolator.

FIG. 2 shows a sigma delta modulated PLL 200 for generating a carrier signal having a controlled frequency. A phase-frequency detector 202 compares a fixed-frequency reference signal 204 to a divided frequency signal 206 provided by a high resolution frequency divider 208. Generation of divided frequency signal 206 is described in greater detail below. Phase detector 202 generates an error signal 210 corresponding to the phase difference (or frequency difference) between the two signals. Phase-frequency detector 202 can be any type of analog, digital, or mixed signal device that compares one signal to another and generates an error signal 210 based on the comparison. In one implementation, error signal 210 comprises an up signal and a down signal in which the pulse widths of the up and down signals indicate the magnitude of the phase (or frequency) error. Error signal 210 can be of other forms—for example, analog signals, tri-level signals, and digital signals having other signal formats.

A charge pump 212 converts error signal 210 from phase detector 202 into a charge pump output signal 214. Charge pump 212 can be any type of charge pump including analog, digital, and mixed signal.

Charge pump output signal 214 generated by charge pump 212 is smoothed by a low pass loop filter 216 to generate a VCO control signal 218. VCO control signal 218 is applied to a multiphase VCO 220 that generates a VCO output signal 222. In steady state, the frequency of VCO output signal 222 (i.e., the output carrier signal) is controlled to accurately correspond to a multiple of fixed-frequency reference signal 204. VCO output signal 222 can be directed to a transmission port (not shown) for wireless transmission of the output carrier signal.

Figure 3:
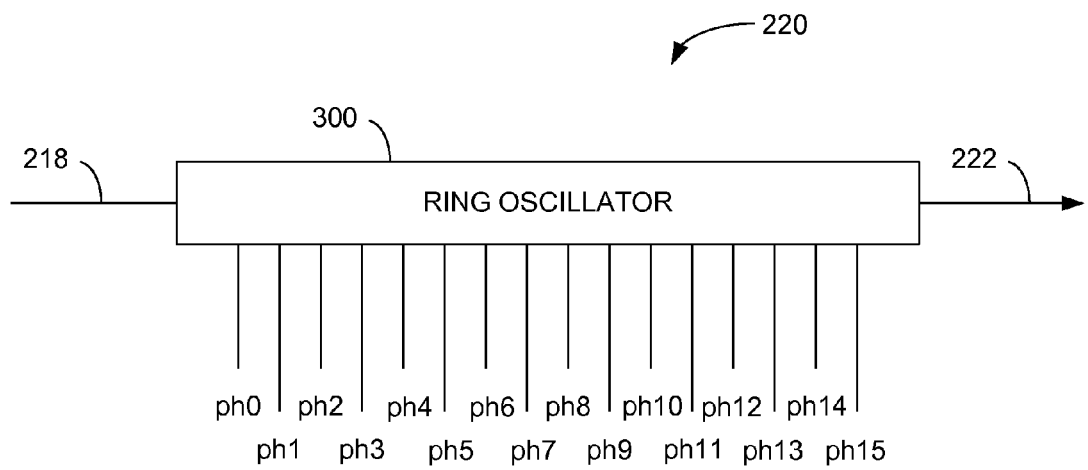
FIG. 3 schematic diagram of a VCO of FIG. 2.
Figure 4:
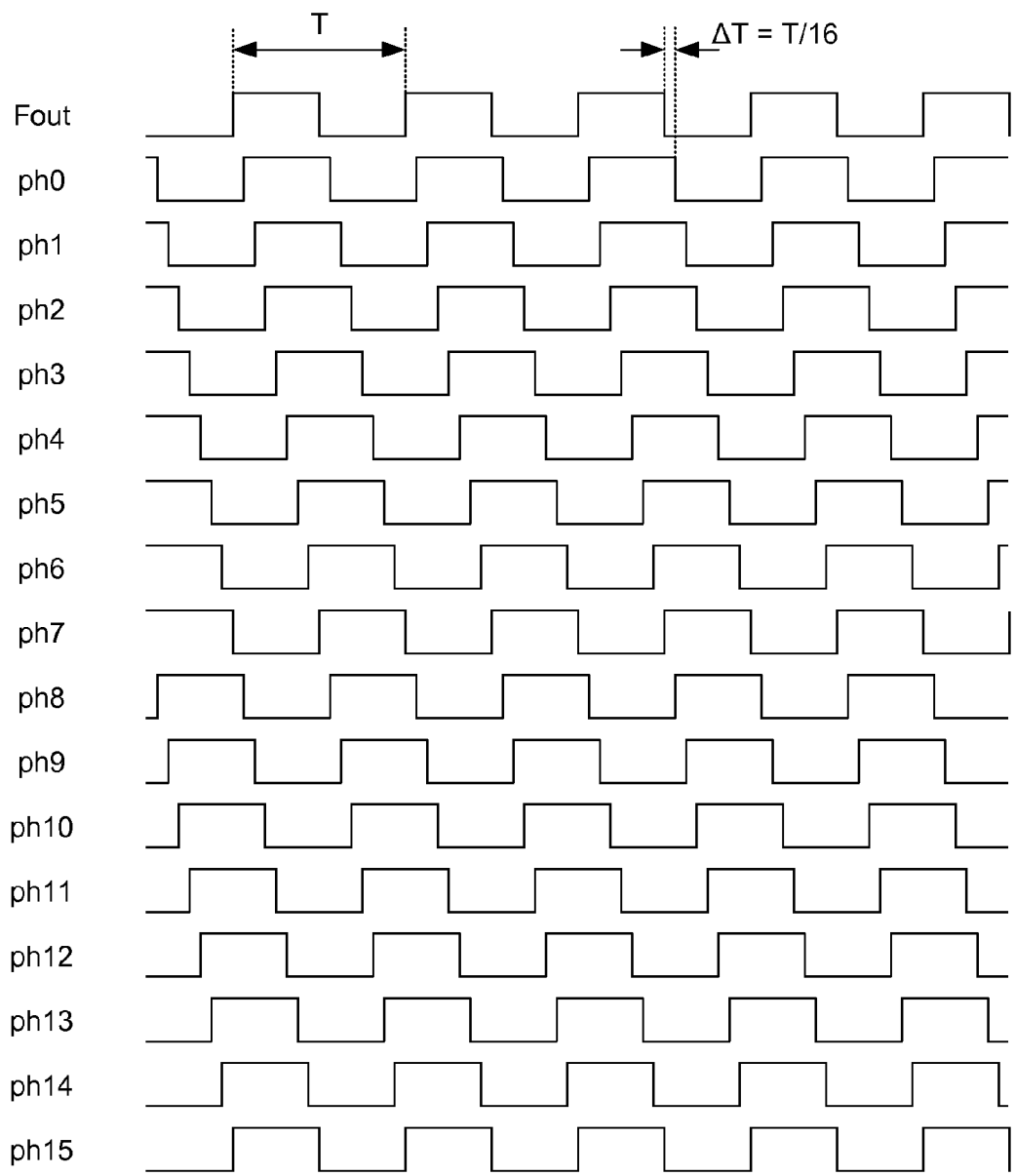
FIG. 4 is a timing diagram illustrating the phase signals of the VCO of FIG. 3.

FIG. 3 is a diagram illustrating an implementation of multiphase VCO 220 shown in FIG. 2. A ring oscillator 300 generates VCO output signal 222 in proportion to VCO control signal 218 received from loop filter 216 (FIG. 2). In addition, ring oscillator 300 generates delay signals (e.g., ph0-ph15) delayed by a predetermined time period (or phase) with respect to VCO output signal 222. The delay signals (e.g., ph0-ph15) can be input into a phase interpolator as described in greater detail below. FIG. 4 shows a timing diagram, for one implementation, of the delay signals (e.g., ph0-ph15). As shown in FIG. 4, each delay signal phi [i=0, 1, ..., 15] has a delay time of $\Delta T*(i+1)$ [i=0, 1, ..., 15] with respect to VCO output signal 222 (Fout). In the example of FIG. 4, in which a cycle of the Fout signal is T, the delay time $\Delta T$ is approximately equal to T/16.

Generation of divided frequency signal 206 (FIG. 2) will now be described in greater detail. Referring again to FIG. 2, PLL 200 includes a feedback loop 224 which includes high resolution frequency divider 208 that includes a phase interpolator 226 and a fractional N divider 228. A sigma delta modulator 230 provides a dither control signal 232 that controls an output 234 of phase interpolator 226 and a dividing ratio of fractional N divider 228. Sigma delta modulator 230 can be of any order suited for a given application, and can be implemented in any convenient topology. The output of fractional N divider 228—i.e., divided frequency signal 206—is applied to phase-frequency detector 202 as discussed above.

The use of phase interpolation in sigma delta modulated PLL 200 increases the effective frequency resolution—i.e., reduces the dividing ratio or step size—of high resolution frequency divider 208. Two or more phases of multiphase VCO 220 can be provided as inputs to phase interpolator 226 for phase interpolation. The greater the number of phases that are input into phase interpolator 226, the finer the resolution of phase interpolation. Optionally, phase generating devices (e.g., a polyphase filter or an injection-locked multiphase oscillator) can be used to generate more phases. Also, any number of stages of frequency dividers—e.g., a prescaler 236 as shown in FIG. 2—can be used to generate additional multiphase inputs 238 for phase interpolator 226.

In one implementation, phase interpolator 226 generates a weighted sum output based on one or more of the received phases to form an interpolated output signal 234 having a desired phase. Any noise that may be caused by mismatch in the phase interpolation process is reduced by dither control signal 232 generated by sigma delta modulator 230. Sigma delta modulator 230 employs a dynamic element matching (DEM) technique to control the desired output phase of phase interpolator 226. That is, sigma delta modulator 226, through the dither control signal 232, makes appropriate selections for the desired phase to be output by phase interpolator 226.

Figure 5:
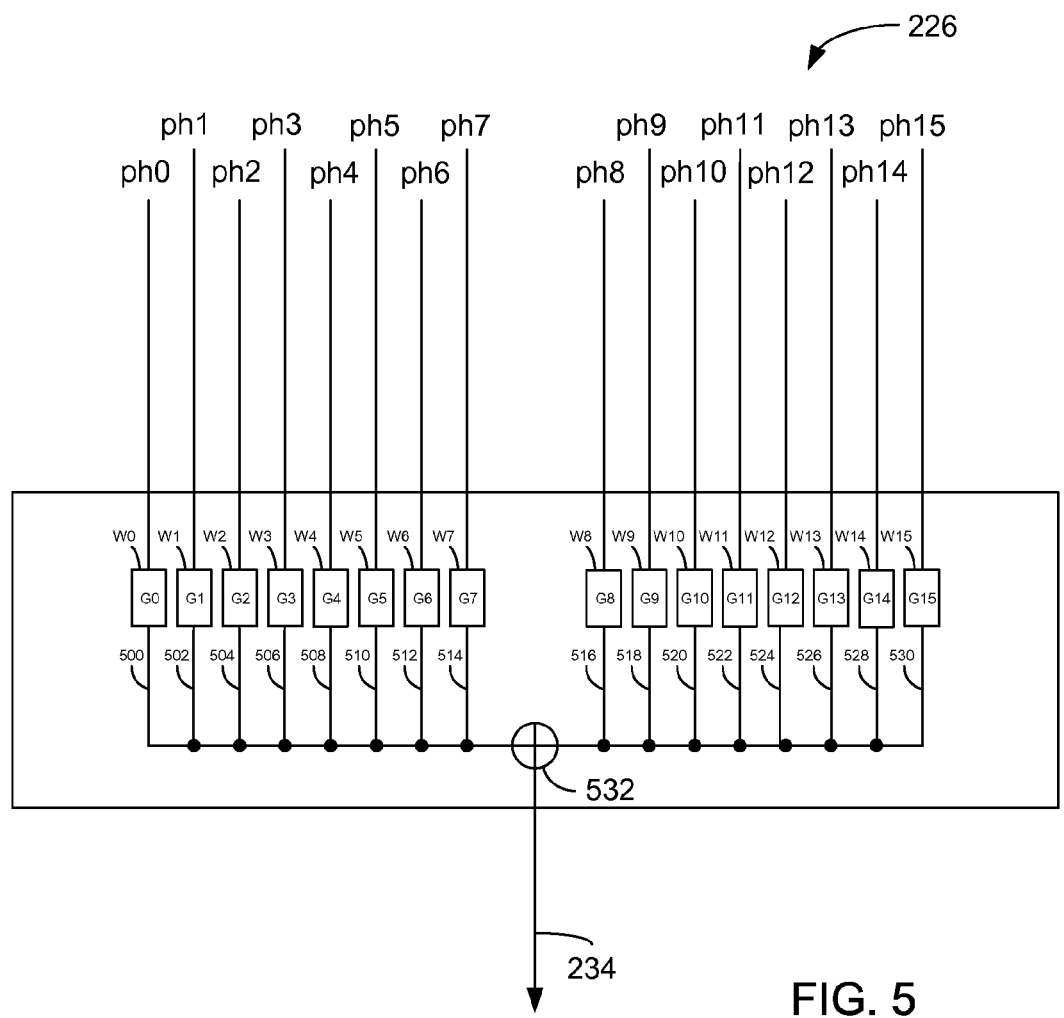
FIG. 5 is a block diagram of a phase interpolator.

FIG. 5 shows an implementation of phase interpolator 226 shown in FIG. 2. As shown in FIG. 5, phase interpolator 226 receives the delay signals (e.g., ph0-ph15) generated by, for example, multiphase VCO 220 (i.e., ring oscillator 300). Phase interpolator 226 can generate interpolated output signal 234 having a phase that is a weighted sum of the input phases (i.e., the delay signals (e.g., ph0-ph15)). The delay signals (e.g., ph0-ph15) are operated on by corresponding weighting functions (e.g., W0-W15). Each weighting function (e.g., W0-W15) weights a corresponding delay signal (e.g., ph0-ph15) based on a weighting coefficient (e.g., G0-G15) and generates weighted delay signals 500-530. Appropriate weighted delay signals 500-530 are summed through accumulator 532 to generate interpolated output signal 234. Interpolated output signal 234 can have a phase according to the following:

$$\text{Phase} = \sum_{i=0}^{15} G_i \text{ph}_i$$

In the example of FIG. 5, a phase corresponding to 10.1 can be generated by the phase interpolator outputting (0.25*ph9+0.4*ph10+0.35*ph11). A desired phase can be output from the phase interpolator based on an appropriate weighting and/or summing of input phases. As such, a very high resolution in the dividing ratio can be obtained by generating an interpolated output signal having an appropriate phase.

Figure 1:
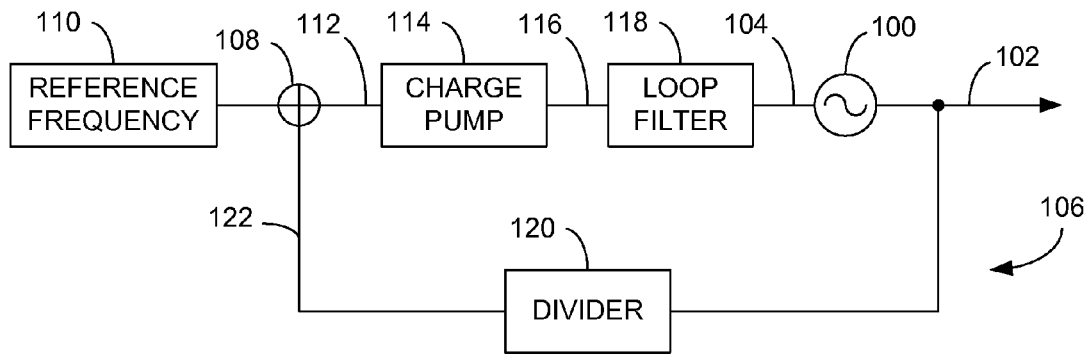
FIG. 1 is a block diagram illustrating a conventional PLL.

Referring back to FIG. 2, interpolated output signal 234 can be provided as an input to a conventional fractional N divider 228 to further divide interpolated output signal 234 to achieve a desired ratio. Fractional N divider 228 can be a multi-modulus divider implemented with any number of moduli, e.g., 2, in a dual modulus divider, or other number of moduli suitable for a given application. Fractional N divider 228 varies its division ratio in response to dither control signal 232 generated by sigma delta modulator 230. The output of fractional N divider 28—i.e., divided frequency signal 206—is provided to phase-frequency detector 202. For example, traditionally a divider (such as frequency divider 120 shown in FIG. 1) can divide a signal based on the following dividing ratio—4/5/6/7. In contrast, high resolution frequency divider 208 can divide the signal based on an effective dividing ratio of 4/4.5/5/5.5/6/6.5/7/7.5.

Figure 6:
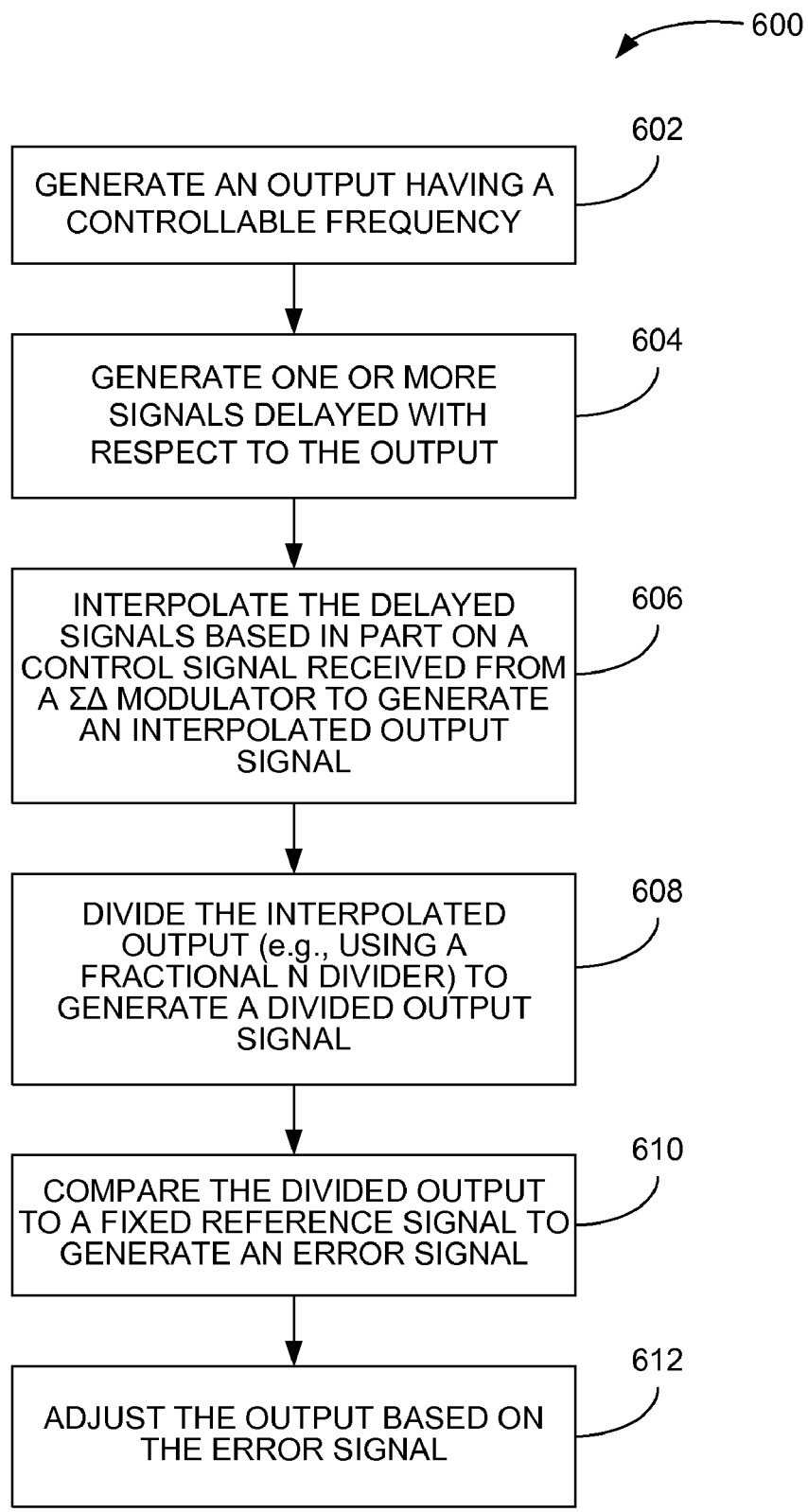
FIG. 6 is a flowchart of a process for generating a divided output signal.

FIG. 6 shows a process 600 for adjusting an output signal. An output signal having a controllable frequency is generated (e.g., by a VCO) (step 602). One or more signals are generated, each delayed with respect to the output signal (step 604). In one implementation, as discussed above, the delayed signals are generated by a multiphase VCO. The delayed signals are interpolated by an interpolator that is controlled, based in part, by a sigma delta modulator (step 606). The interpolator generates an interpolated output signal that is divided with respect to the generated output signal. The interpolated output signal can be further divided (e.g., by a fractional N divider) to generate a divided output signal (step 608). The divided output is compared to a reference signal, and an error signal is generated based on a difference between the divided output signal and the reference signal (step 610). The output signal (e.g., generated by a VCO) is adjusted based on the error signal (step 612).

Figure 7:
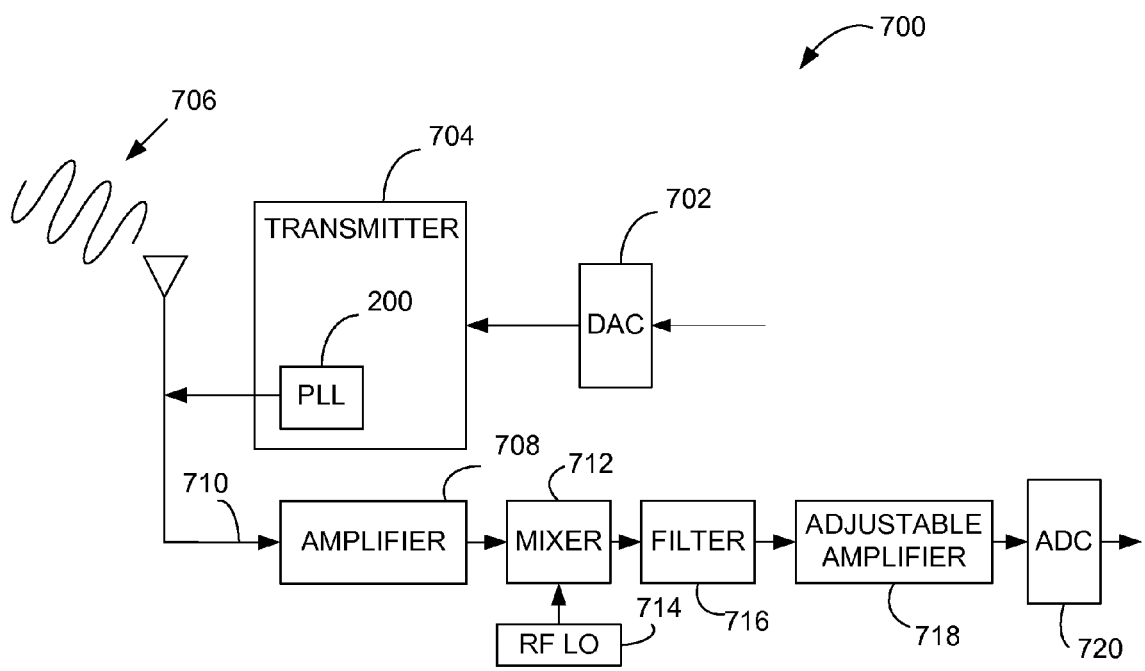
FIG. 7 is a schematic diagram of a wireless transceiver.

Sigma delta modulated PLL 200 with phase interpolation can be employed in a wide range of applications, for example, in a wireless transceiver 700, as shown in FIG. 7. Wireless transceiver 700 can include a digital-to-analog converter (DAC) 702 and a transmitter 704 for wireless transmission of a modulated carrier signal 706. The frequency of modulated carrier signal 706 can be controlled by PLL 200, described above, within transmitter 704. Wireless transceiver 700 can also include an amplifier 708 for amplifying an input signal 710 (i.e., a received signal). A mixer 712 can combine an amplified version of the input signal with a radio frequency (RF) local oscillator (LO) signal 714. A filter 716 and adjustable amplifier 718 filter and amplify the combined signal. The combined signal is mixed with an Intermediate Frequency (IF) LO signal (not shown). An analog-to-digital converter (ADC) 720 converts the mixed signal to a digital signal for further processing. Wireless transceiver 700 can be IEEE 802 compliant with the following standards 802.11, 802.11a, 802.11b, 802.11e, 802.11g, 802.11h, 802.11i, and 802.14.

A number of embodiments of the invention have been described. Nevertheless, it will be understood that various modifications may be made without departing from the spirit and scope of the invention. For example, the VCO can be multiphase, as described above, differential or single-ended, or formed by an inductor-capacitor (LC) tank circuit. Also, an integer-only divider can be used in place of the fractional N divider within the feedback loop of the PLL. Furthermore, fixed-frequency reference signal 204 can be implemented as a reference signal that varies. Accordingly, other implementations are within the scope of the following claims.

What is claimed is:

1. A phase locked loop, comprising:
    a modulator operable to generate a control signal; and
    a phase interpolator operable to receive one or more phase signals, each of the phase signals being delayed with respect to an output carrier signal, the phase interpolator operable to generate an interpolated output signal based in part on the control signal for controlling a frequency of the output carrier signal.

2. The phase locked loop of claim 1, wherein the interpolated output signal is a weighted sum of one or more of the one or more phase signals.

3. The phase locked loop of claim 2, further comprising:
    a divider to receive the interpolated output signal from the phase interpolator, the divider operable to divide the interpolated output signal based in part on the control signal and generate a divided output signal.

4. The phase lock loop of claim 3, wherein the divider is a fractional N divider operable to fractionally divide the interpolated output signal.

5. The phase lock loop of claim 3, wherein the divider is an integer only divider operable to divide the interpolated output signal by integers.

6. The phase lock loop of claim 3, further comprising:
    a multiphase voltage controlled oscillator operable to generate one or more delay signals, each of the one or more delay signals being delayed by a predetermined time period with respect to the output carrier signal.

7. The phase lock loop of claim 6, wherein one or more of the one or more phase signals are derived based at least in part from the one or more delay signals.

8. The phase lock loop of claim 3, further comprising a prescaler operable to generate one or more of the one or more phase signals for the phase interpolator.

9. The phase lock loop of claim 3, further comprising a phase-frequency detector operable to compare a reference signal to the divided output signal and generate an error signal corresponding to a frequency difference between the reference signal and the divided output signal.

10. The phase lock loop of claim 9, further comprising a charge pump operable to convert the error signal into a charge pump output signal.

11. The phase lock loop of claim 10, further comprising a loop filter operable to smooth the charge pump output signal and generate a voltage controlled oscillator control signal to control a voltage controlled oscillator.

12. A method comprising:
generating a control signal;
generating one or more phase signals, each of the phase signals being delayed with respect to an output carrier signal; and
interpolating the phase signals and generating an interpolated output signal based in part on the control signal for controlling a frequency of the output carrier signal.

13. The method of claim 12, wherein the interpolated output signal is a weighted sum of one or more of the one or more phase signals.

14. The method of claim 13, further comprising:
dividing the interpolated output signal based in part on the control signal and generating a divided output signal.

15. The method of claim 14, wherein the divided output signal is fractionally divided with respect to the interpolated output signal.

16. The method of claim 14, wherein the divided output signal is divided by an integer with respect to the interpolated output signal.

17. The method of claim 14, further comprising:
generating the output carrier signal based on the control signal, wherein generating the output carrier signal comprises generating one or more delay signals delayed by a predetermined time period with respect to the output carrier signal.

18. The method of claim 17, wherein one or more of the one or more phase signals are generated based at least in part on the one or more delay signals.

19. The method of claim 14, further comprising generating one or more of the one or more phase signals to be interpolated based at least in part on frequency division.

20. The method of claim 14, further comprising:
comparing a reference signal to the divided output signal; and
generating an error signal corresponding to a phase difference between the reference signal and the divided output signal.

21. The method of claim 20, further comprising converting the error signal into a charge pump output signal.

22. The method of claim 21, further comprising, smoothing the charge pump output signal and generating a voltage controlled oscillator control signal to control a voltage controlled oscillator.

23. A phase locked loop, comprising:
means for generating a control signal; and
means for receiving one or more phase signals, each of the phase signals being delayed with respect to an output carrier signal, and generating an interpolated output signal based in part on the control signal for controlling a frequency of the output carrier signal.

24. The phase lock loop of claim 23, wherein the interpolated output signal is a weighted sum of one or more of the one or more phase signals.

25. The phase lock loop of claim 24, further comprising:
means for dividing the interpolated output signal based in part on the control signal and generating a divided output signal.

26. The phase lock loop of claim 25, wherein the means for dividing is operable to fractionally divide the interpolated output signal.

27. The phase lock loop of claim 25, wherein the means for dividing is operable to divide the interpolated output signal by integers.

28. The phase lock loop of claim 25, further comprising:
means for generating an output carrier signal based on the control signal, wherein the means for generating an output carrier signal is operable to generate one or more delay signals, each of the one or more delay signals being delayed by a predetermined time period with respect to the output carrier.

29. The phase lock loop of claim 28, wherein one or more of the one or more phase signals are derived based at least in part from the one or more delay signals.

30. The phase lock loop of claim 25, further comprising means for generating one or more of the one or more phase signals.

31. The phase lock loop of claim 25, further comprising means for comparing a reference signal to the divided output signal and generating an error signal corresponding to a frequency difference between the reference signal and the divided output signal.

32. The phase lock loop of claim 31, further comprising pumping means for converting the error signal into a charge pump output signal.

33. The phase lock loop of claim 32, further comprising means for smoothing the charge pump output signal and generating a voltage controlled oscillator control signal to control a voltage controlled oscillator.

* * * * *